(12) United States Patent
Ayers

(10) Patent No.: US 7,790,234 B2
(45) Date of Patent: Sep. 7, 2010

(54) LOW DIELECTRIC CONSTANT MATERIALS PREPARED FROM SOLUBLE FULLERENE CLUSTERS

(76) Inventor: Michael Raymond Ayers, 9 Woodgate Pl., Palm Coast, FL (US) 32164

( * ) Notice: Subject to any disclaimer, the term of this patent is extended or adjusted under 35 U.S.C. 154(b) by 530 days.

(21) Appl. No.: 11/806,482

(22) Filed: May 31, 2007

(65) Prior Publication Data

US 2008/0044642 A1 Feb. 21, 2008

Related U.S. Application Data

(60) Provisional application No. 60/809,403, filed on May 31, 2006.

(51) Int. Cl.
*B05D 1/36* (2006.01)
(52) U.S. Cl. .............. 427/384; 427/385.5; 427/387; 427/402; 427/409; 427/421.1; 427/427.4; 427/430.1; 427/443.2; 427/240
(58) Field of Classification Search .......... None
See application file for complete search history.

(56) References Cited

U.S. PATENT DOCUMENTS

| | | | |
|---|---|---|---|
| 4,002,800 A | 1/1977 | Nestler et al. | |
| 4,652,467 A | 3/1987 | Brinker et al. | |
| 4,987,101 A | 1/1991 | Kaanta et al. | |
| 5,103,288 A | 4/1992 | Sakamoto et al. | |
| 5,294,732 A | 3/1994 | Chiang et al. | |
| 5,308,481 A | 5/1994 | Stalling et al. | |
| 5,338,571 A | 8/1994 | Mirkin et al. | |
| 5,386,048 A | 1/1995 | West et al. | |
| 5,416,188 A | 5/1995 | Chiang et al. | |
| 5,420,081 A | 5/1995 | Mattes et al. | |
| 5,470,820 A | 11/1995 | Hauser et al. | |
| 5,494,859 A | 2/1996 | Kapoor | |
| 5,679,861 A * | 10/1997 | Kuo et al. | 564/458 |
| 5,698,140 A | 12/1997 | Lamb et al. | |
| 5,739,376 A | 4/1998 | Bingel | |
| 5,744,399 A | 4/1998 | Rostoker et al. | |
| 5,801,092 A | 9/1998 | Ayers | |
| 5,851,503 A | 12/1998 | Mitani et al. | |
| 5,965,202 A | 10/1999 | Taylor-Smith et al. | |
| 6,066,272 A | 5/2000 | Tang et al. | |
| 6,083,624 A | 7/2000 | Hiura | |
| 6,113,673 A | 9/2000 | Loutfy et al. | |

(Continued)

FOREIGN PATENT DOCUMENTS

EP    0 647 606 A1    4/1995

(Continued)

OTHER PUBLICATIONS

Ulug et al, Fullerene Science and Technology, 5(7), pp. 1651-1658, 1997.*

(Continued)

*Primary Examiner*—Erma Cameron
(74) *Attorney, Agent, or Firm*—Sterne, Kessler, Goldstein & Fox, PLLC.

(57) ABSTRACT

This disclosure relates generally to polymeric networks of fullerene compounds, to methods of preparing precursors for such networks, and to their subsequent use as low dielectric constant materials in microelectronic devices.

19 Claims, 3 Drawing Sheets

U.S. PATENT DOCUMENTS

| | | |
|---|---|---|
| 6,187,427 B1 | 2/2001 | Taylor-Smith et al. |
| 6,214,746 B1 | 4/2001 | Leung et al. |
| 6,255,241 B1 | 7/2001 | Miyazawa et al. |
| 6,277,766 B1 | 8/2001 | Ayers |
| 6,287,979 B1 | 9/2001 | Zhou et al. |
| 6,368,569 B1 | 4/2002 | Haddon et al. |
| 6,380,270 B1 | 4/2002 | Yates |
| 6,423,811 B1 | 7/2002 | Lau et al. |
| 6,599,492 B2 | 7/2003 | Iwamura et al. |
| 6,713,590 B2 | 3/2004 | Lau et al. |
| 6,743,481 B2 | 6/2004 | Hoehn et al. |
| 6,790,790 B1 | 9/2004 | Lyons et al. |
| 6,797,777 B2 | 9/2004 | Lau et al. |
| 6,855,202 B2 | 2/2005 | Alivisatos et al. |
| 6,967,222 B2 | 11/2005 | Khanarian et al. |
| 6,984,265 B1 | 1/2006 | Raguse et al. |
| 6,987,147 B2 | 1/2006 | Lau et al. |
| 6,998,178 B2 | 2/2006 | Apen et al. |
| 7,011,890 B2 | 3/2006 | Nguyen et al. |
| 7,014,681 B2 | 3/2006 | Noack et al. |
| 7,060,204 B2 | 6/2006 | Li et al. |
| 2001/0016608 A1 | 8/2001 | Haddon et al. |
| 2001/0041801 A1 | 11/2001 | Friedman et al. |
| 2002/0016414 A1 | 2/2002 | Lau et al. |
| 2002/0037941 A1 | 3/2002 | Lau et al. |
| 2002/0061397 A1 | 5/2002 | Iwamura et al. |
| 2003/0072947 A1 | 4/2003 | Lee et al. |
| 2003/0151031 A1 | 8/2003 | Li et al. |
| 2003/0162002 A1 | 8/2003 | Lau et al. |
| 2003/0187139 A1 | 10/2003 | Lau et al. |
| 2003/0213958 A1 | 11/2003 | Nakagawa et al. |
| 2004/0005506 A1 | 1/2004 | Nishimura |
| 2004/0038408 A1 | 2/2004 | Abbott et al. |
| 2004/0046155 A1 | 3/2004 | Li et al. |
| 2004/0102584 A1 | 5/2004 | Lau et al. |
| 2004/0121501 A1 | 6/2004 | Large et al. |
| 2004/0132846 A1 | 7/2004 | Leventis et al. |
| 2004/0175568 A1 | 9/2004 | Takaguchi |
| 2004/0175581 A1 | 9/2004 | Nguyen et al. |
| 2004/0180201 A1 | 9/2004 | Veedu et al. |
| 2004/0185448 A1 | 9/2004 | Lopez-Avila |
| 2004/0250750 A1 | 12/2004 | Reda et al. |
| 2005/0020702 A1 | 1/2005 | Li et al. |
| 2005/0089684 A1 | 4/2005 | Barron et al. |
| 2005/0119360 A1 | 6/2005 | Kawakami et al. |
| 2005/0238889 A1 | 10/2005 | Iwamoto et al. |
| 2005/0263908 A1 | 12/2005 | Nakagawa et al. |
| 2005/0279399 A1 | 12/2005 | Gaudiana et al. |
| 2006/0002875 A1 | 1/2006 | Winkler et al. |
| 2006/0024502 A1 | 2/2006 | McFarland et al. |
| 2006/0071300 A1 | 4/2006 | Haverty et al. |
| 2006/0093885 A1 | 5/2006 | Krusic et al. |
| 2006/0106152 A1 | 5/2006 | Metzinger et al. |
| 2006/0185794 A1 | 8/2006 | Ayers |

FOREIGN PATENT DOCUMENTS

| | | |
|---|---|---|
| EP | 1 015 384 B1 | 7/2000 |
| EP | 1 063 197 A2 | 12/2000 |
| EP | 1 190 422 B1 | 3/2002 |
| EP | 1 244 731 B1 | 10/2002 |
| EP | 1 265 080 A2 | 12/2002 |
| EP | 1 473 770 A1 | 11/2004 |
| GB | 2 380 496 A | 4/2003 |
| JP | 5-254955 A | 10/1993 |
| JP | 6-324681 A | 11/1994 |
| JP | 8-181133 A | 7/1996 |
| JP | 8-245209 A | 9/1996 |
| JP | 9-316202 A | 12/1997 |
| JP | 10-310709 A | 11/1998 |
| JP | 11-263916 A | 9/1999 |
| JP | 2000-154191 A | 6/2000 |
| JP | 2000-268632 A | 9/2000 |
| JP | 2001-192322 A | 7/2001 |
| JP | 2002-6478 A | 1/2002 |
| JP | 2002-72964 A | 3/2002 |
| JP | 2003-3047 A | 1/2003 |
| JP | 2003-3119 A | 1/2003 |
| JP | 2003-176113 A | 6/2003 |
| JP | 2003-280249 A | 10/2003 |
| JP | 2003-321214 A | 11/2003 |
| JP | 2004-182771 A | 7/2004 |
| JP | 2005-53832 A | 3/2005 |
| JP | 2005-105152 A | 4/2005 |
| JP | 2005-119167 A | 5/2005 |
| JP | 2005-144601 A | 6/2005 |
| JP | 2005-263509 A | 9/2005 |
| JP | 2005-268550 A | 9/2005 |
| JP | 2005-272639 A | 10/2005 |
| JP | 2005-289755 A | 10/2005 |
| JP | 2005-290316 A | 10/2005 |
| WO | WO 98/07793 A1 | 2/1998 |
| WO | WO 00/68956 A1 | 11/2000 |
| WO | WO 01/25316 A1 | 4/2001 |
| WO | WO 01/78110 A2 | 10/2001 |
| WO | WO 01/91922 A2 | 12/2001 |
| WO | WO 02/06366 A1 | 1/2002 |
| WO | WO 02/30814 A1 | 4/2002 |
| WO | WO 02/081546 A1 | 10/2002 |
| WO | WO 03/018645 A1 | 3/2003 |
| WO | WO 03/057749 A1 | 7/2003 |
| WO | WO 03/060979 A2 | 7/2003 |
| WO | WO 03/061029 A2 | 7/2003 |
| WO | WO 2004/000909 A1 | 12/2003 |
| WO | WO 2004/079814 A2 | 9/2004 |
| WO | WO 2005/008761 A1 | 1/2005 |
| WO | WO 2005/010071 A1 | 2/2005 |
| WO | WO 2005/028174 A2 | 3/2005 |
| WO | WO 2006/023921 A2 | 3/2006 |
| WO | WO 2006/028704 A2 | 3/2006 |
| WO | WO 2006/028776 A1 | 3/2006 |

OTHER PUBLICATIONS

Wang, *Tetrahedron*, 58, pp. 2377-2380, 2002.*

Chen, K., et al., "Fullerene Self-Assembly onto $(MeO)_3Si(CH_2)_3NH_2$-Modified Oxide Surfaces," *J. Am. Chem. Soc.* 115:1193-1194, American Chemical Society (1993).

Hirsch, A., et al., "Globe-trotting Hydrogens on the Surface of the Fullerene Compound $C_{60}H_6(N(CH_2CH_2)_2O)_6$," *Angew. Chem. Int. Ed. Engl.* 30:1309-1310, VCH Verlagsgesellschaft mbH (1991).

Hirsch, A., et al., "Regioselective Multiple Additions to Buckminsterfullerene," in *The Chemical Physics of Fullerenes 10 (and 5) Years Later*, Andreoni, W., ed., Kluwer Academic Publishers, Boston, MA, pp. 267-283 (1996).

Jenekhe, S.A., and Chen, X.L., "Self-Assembly of Ordered Microporous Materials from Rod-Coil Block Copolymers," *Science* 283:372-375, American Association for the Advancement of Science (1999).

Liang, C., et al., "Synthesis of a Large-Scale Highly Ordered Porous Carbon Film by Self-Assembly of Block Copolymers," *Angew. Chem. Int. Ed.* 43:5785-5789, Wiley-VCH Verlag GmbH & Co. KGaA (Nov. 2004).

Maggini, M., et al., "$C_{60}$ Derivatives Embedded in Sol-Gel Silica Films," *Adv. Mater.* 7:404-406, VCH Verlagsgesellschaft mbH (1995).

Ouyang, J., et al., "Structures and Properties of Supramolecular Assembled Fullerenol/Poly(dimethylsiloxane) Nanocomposites," *J. Phys. Chem. B* 108:5937-5943, American Chemical Society (May 2004).

Wudl, F., et al., "Survey of Chemical Reactivity of $C_{60}$, Electrophile and Dieno-polarophile Par Excellence," in *ACS Symposium Series—Fullerenes*, Hammond, G.S., and Kuck, V.J., eds., American Chemical Society, Washington, DC, pp. 161-175 (1992).

Yevlampieva, N., et al., "Star-like Fullerene Containing Poly(Vinylpyrrolydone) Derivatives: Chloroform Solution Properties," *Fullerenes, Nanotubes, and Carbon Nanostructures* 12:353-359, Marcel Dekker, Inc. (Aug. 2004).

Patent Abstracts of Japan, unverified English language abstract for JP 5-254955 A (Document FP1 listed on accompanying PTO/SB/08A).

Patent Abstracts of Japan, unverified English language abstract for JP 6-324681 A (Document FP2 listed on accompanying PTO/SB/08A).

Patent Abstracts of Japan, unverified English language abstract for JP 8-181133 A (Document FP4 listed on accompanying PTO/SB/08A).

Patent Abstracts of Japan, unverified English language abstract for JP 8-245209 A (Document FP5 listed on accompanying PTO/SB/08A).

Patent Abstracts of Japan, unverified English language abstract for JP 9-316202 A (Document FP6 listed on accompanying PTO/SB/08A).

Patent Abstracts of Japan, unverified English language abstract for JP 11-0263916 A (Document FP7 listed on accompanying PTO/SB/08A).

Patent Abstracts of Japan, unverified English language abstract for JP 10-310709 A (Document FP8 listed on accompanying PTO/SB/08A).

Patent Abstracts of Japan, unverified English language abstract for JP 2000-154191 A (Document FP10 listed on accompanying PTO/SB/08A).

Patent Abstracts of Japan, unverified English language abstract for JP 2000-268632 A (Document FP11 listed on accompanying PTO/SB/08A).

Patent Abstracts of Japan, unverified English language abstract for JP 2001-192322 A (Document FP15 listed on accompanying PTO/SB/08A).

Patent Abstracts of Japan, unverified English language abstract for JP 2002-6478 A (Document FP18 listed on accompanying PTO/SB/08A).

Patent Abstracts of Japan, English language translation for JP 2002-72964 A (Document FP19 listed on accompanying PTO/SB/08A).

Patent Abstracts of Japan, unverified English language abstract for JP 2003-3047 A (Document FP26 listed on accompanying PTO/SB/08A).

Patent Abstracts of Japan, unverified English language abstract for JP 2003-3119 A (Document FP27 listed on accompanying PTO/SB/08A).

Patent Abstracts of Japan, unverified English language abstract for JP 2003-176113 A (Document FP30 listed on accompanying PTO/SB/08A).

Patent Abstracts of Japan, unverified English language abstract for JP 2003-280249 A (Document FP34 listed on accompanying PTO/SB/08A).

Patent Abstracts of Japan, unverified English language abstract for JP 2003-321214 A (Document FP36 listed on accompanying PTO/SB/08A).

Patent Abstracts of Japan, unverified English language abstract for JP 2004-182771 A (Document FP37 listed on accompanying PTO/SB/08A).

Patent Abstracts of Japan, unverified English language abstract for JP 2005-53832 A (Document FP42 listed on accompanying PTO/SB/08A).

Patent Abstracts of Japan, unverified English language abstract for JP 2005-105152 A (Document FP44 listed on accompanying PTO/SB/08A).

Patent Abstracts of Japan, unverified English language abstract for JP 2005-119167 A (Document FP45 listed on accompanying PTO/SB/08A).

Patent Abstracts of Japan, unverified English language abstract for JP 2005-144601 A (Document FP46 listed on accompanying PTO/SB/08A).

Patent Abstracts of Japan, unverified English language abstract for JP 2005-263509 A (Document FP47 listed on accompanying PTO/SB/08A).

Patent Abstracts of Japan, unverified English language abstract for JP 2005-268550 A (Document FP48 listed on accompanying PTO/SB/08A).

Patent Abstracts of Japan, unverified English language abstract for JP 2005-272639 A (Document FP49 listed on accompanying PTO/SB/08A).

Patent Abstracts of Japan, unverified English language abstract for JP 2005-289755 A (Document FP50 listed on accompanying PTO/Sb/08A).

Patent Abstracts of Japan, unverified English language abstract for JP 2005-290316 A (Document FP51 listed on accompanying PTO/SB/08A).

Dialog File 351, Accession No. 7111280, unverified English language abstract for EP 0 647 606 A1 (Document FP3 listed on accompanying PTO/SB/08A).

Jena, P., and Khanna, S.N., "Physics of cluster assembled materials," *Mater. Sci. Eng.* A217/A218:218-222, Elsevier Science S.A. (1996).

Matsuura, M., et al., "On the role of small additives for nanocrystalline formation from amorphous matrix," *Mater. Sci. Eng.* A217/A218:397-400, Elsevier Science S.A. (1996).

Ohno, K., et al., "Ab-initio molecular dynamics study of the stability and reactivity of $C_{60}$," *Mater. Sci. Eng.* A217/A218:19-22, Elsevier Science S.A. (1996).

Co-pending U.S. Appl. No. 11/806,464, inventor Ayers, M.R., filed May 31, 2007 (Not Published).

Co-pending U.S. Appl. No. 11/806,463, inventor Ayers, M.R., filed May 31, 2007 (Not Published).

Co-pending U.S. Appl. No. 11/806,465, inventor Ayers, M.R., filed May 31, 2007 (Not Published).

The International Search Report completed for Application No. PCT/US07/12836 on Sep. 20, 2007 and mailed on Nov. 5, 2007.

The International Search Report completed for Application No. PCT/US07/12835 on Oct. 3, 2007 and mailed on Nov. 28, 2007.

The International Search Report completed for Application No. PCT/US07/12831 on Oct. 19, 2007 and mailed on Dec. 5, 2007.

A Non-Final Office Action issued in the co-pending U.S. Appl. No. 10/906,534, filed Nov. 27, 2007.

The International Search Report completed for Application No. PCT/US07/12832 on Oct. 24, 2007 and mailed on Dec. 18, 2007.

* cited by examiner

LOW DIELECTRIC CONSTANT MATERIALS PREPARED FROM SOLUBLE FULLERENE CLUSTERS

CROSS REFERENCE TO RELATED APPLICATIONS

This application claims the benefit of U.S. Provisional Patent Application No. 60/809,403, filed May 31, 2006, the disclosure of which is incorporated by reference herein in its entirety.

BACKGROUND OF THE INVENTION

Field of the Invention

This disclosure relates generally to fullerene-comprising compounds, methods of preparing such compounds, and to their subsequent use as low dielectric constant materials in microelectronic devices.

BRIEF SUMMARY OF THE INVENTION

In one embodiment, the present invention provides methods for preparing a fullerene cluster. In such embodiments a bifunctional coupling agent is added to two or more fullerenes (e.g., $C_{60}$), whereby the fullerenes are coupled together to form a fullerene cluster. Exemplary bifunctional coupling agents suitably comprise a primary or secondary amine. Suitable bifunctional coupling agents include 1,3-diaminopropane, 1,4-diaminonobutane, 1,6-diaminohexane, 3-aminopropyl-1,7-diaminoheptane, 4,4-di-4-aminobutyl-1,9-diaminononane, 1,3,5-tri-4-aminobutylcylcohexane, 1,4,-diamino-2-butyne, di-2-aminoethyl ether, and p-di-2-aminoethylbenzene.

The present invention also provides methods for preparing a fullerene polymer film. For example, two or more fullerene clusters according to the method of the present invention. The fullerene (e.g., $C_{60}$) clusters are then derivatized with at least one reactive arm to form derivatized fullerene clusters. The derivatized fullerene clusters are then dissolved in a solvent, and then applied onto a substrate. Then, the derivatized fullerene clusters are cured to form a fullerene polymer film. Exemplary reactive arms for use in practicing the invention suitably comprise a reactive group coupled to the fullerenes; an organic spacer portion; and a metal or metalloid alkoxide. Reactive arms for use in the practice of the present invention suitably comprise: an amine, an azide, a diene or a carbanion; an alkyl organic spacer portion; and a metal or metalloid alkoxide selected from the group consisting of —$Si(OR)_3$, —$Ge(OR)_3$—$Ti(OR)_3$, —$Zr(OR)_3$, —$Sn(OR)_3$, —$Al(OR)_2$ and —$B(OR)_2$. Exemplar reactive arms include, but are not limited to, 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexanediaminomethyltriethoxysilane and 11-aminoundecyltriethoxysilane.

In suitable embodiments, the applying comprises spin-coating, dip-coating or spray-coating, and the curing comprises heating to between about 80° C. to 200° C. in a moist atmosphere. In some embodiments, the curing comprises heating the derivatized fullerene clusters to greater than about 150° C.

The present invention also provides fullerene clusters and fullerene polymer films, including those prepared by the various methods described throughout, as well as microelectronic devices comprising the films.

BRIEF DESCRIPTION OF THE DRAWINGS/FIGURES

DETAILED DESCRIPTION OF THE INVENTION

Figure 1:
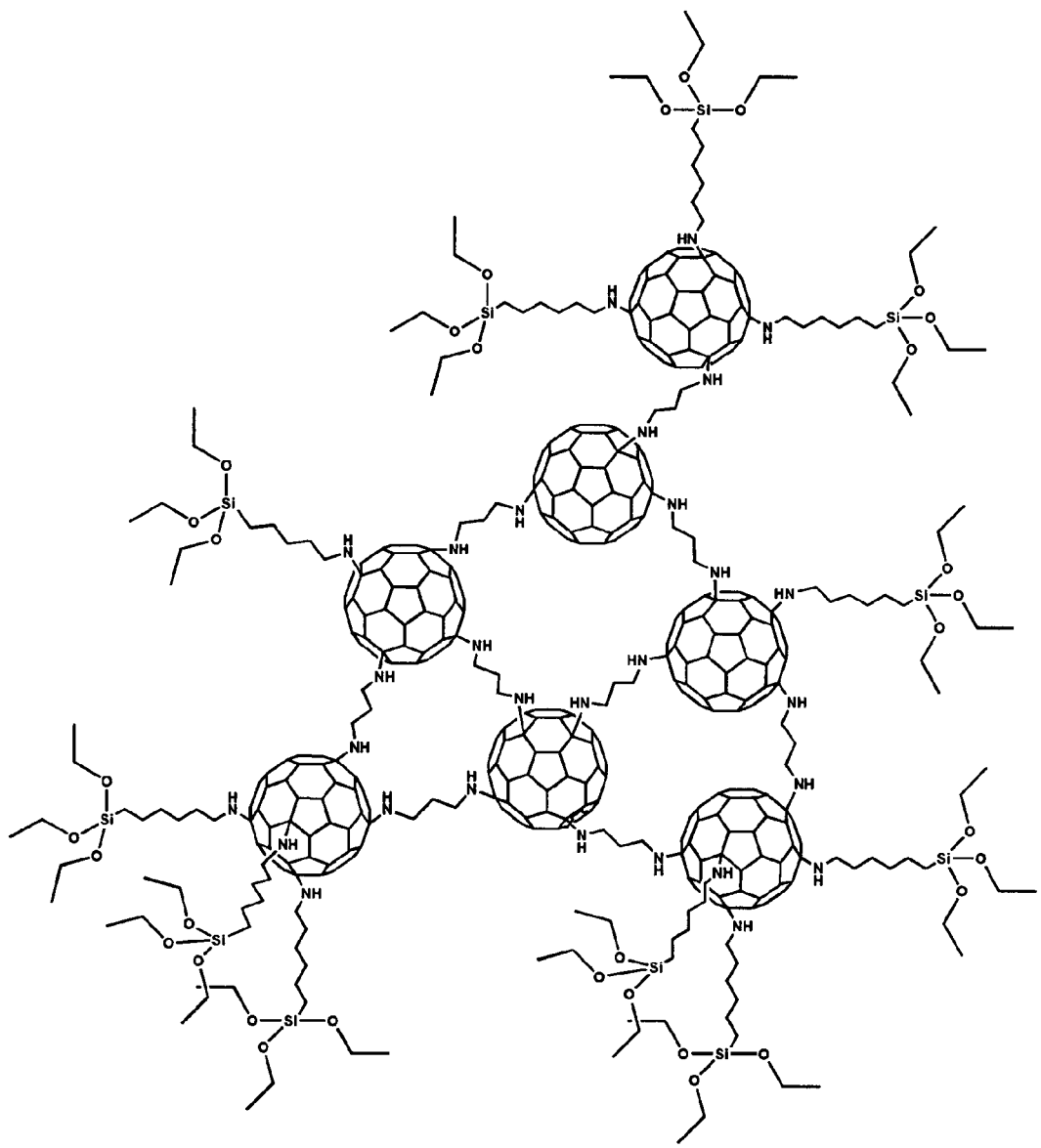
FIG. 1 shows a cross section of derivatized fullerene clusters.

Derivatized fullerene clusters are well-suited for forming three-dimensional networks of cage compounds, and comprise a central core comprising two or more fullerene cages linked together by one or more bifunctional coupling agents. Fullerene clusters prepared in this way can be subsequently further derivatized by one or more reactive radial arms. Such derivatized fullerene clusters possess a high solubility in common solvents and the ability to form three-dimensional network polymers upon condensation with adjacent clusters. These clusters and polymers are largely composed of fragments exhibiting intrinsically low dielectric constants. Methods for polymerizing the fullerene clusters as films on a desired substrate, especially when such films are used as intra- or interlayer dielectrics for microelectronic devices, are also disclosed. Any preparative route that produces a similar soluble, reactive fullerene cluster, where the core is surrounded by one or more arms each terminated by a reactive group may be used. The use of a bifunctional coupling agent to form the reactive arms that may contain, at one end an amine group and at the opposite end a metal- or metalloid-alkoxide, are disclosed. Any coupling agent which is capable of both reacting with a fullerene and undergoing condensation reactions with other identical coupling agents may be used.

The fullerene core of the fullerene clusters can include one or more of the following: $C_{60}$, $C_{70}$, $C_{72}$, $C_{74}$, $C_{76}$, $C_{78}$, $C_{84}$, $C_{96}$, and higher analogues up to, and beyond, $C_{184}$ or mixtures thereof. Commercially available mixtures of $C_{60}$ and $C_{70}$, commonly know as Fullerite, fullerene extract, or fullerene soot may also be used.

The preparation of a fullerene cluster core of linked-fullerene cages is described herein. A fullerene molecule is reacted with a specific amount of a bifunctional coupling agent. Exemplary coupling agents suitably comprise a linear or branched alkyl chain terminated by reactive groups at each chain end. For example, the coupling agent may contain between 3 and 20 alkyl units, e.g., between 3 and 9 alkyl units. However, when greater rigidity, or other variations of chemical or physical properties are desirable, the alkyl chain may include one or more heteroatomic groups, including, but not limited to, ether groups or amino groups, or one or more rigid components, including, but not limited to, alkynyl-segments, aryl-segments, or other cyclic segments.

Terminal groups on the coupling agent may comprise primary or secondary amines. Amines react with fullerenes in a facile manner by nucleophilic addition reactions across one of the many delocalized bonds of the fullerene cage. Other reactive groups, especially other nucleophiles, may be used. These include, but are not limited to, azides, dienes, and carbanions. However, any reactive group which may be found to conveniently react with fullerenes may be used.

The following are non-limiting examples of commercially available coupling agents; 1,3-diaminopropane, 1,4-diaminobutane, 1,6-diaminohexane, 3-aminopropyl-1,7-diaminoheptane, 4,4-di-4-aminobutyl-1,9-diaminononane, 1,3,5-tri-4-aminobutylcylcohexane, 1,4,-diamino-2-butyne, di-2-aminoethyl ether, and p-di-2-aminoethylbenzene. However, numerous additional compounds may also prove useful.

The ratio of fullerene to coupling agent largely determines the final size of the resulting fullerene clusters. The amount of coupling agent required to form the smallest possible cluster, namely two fullerene cages linked together, is about 0.5 mol of coupling agent per mol of fullerene when the agent is bifunctional; about 0.33 mol of coupling agent per mol of fullerene when the agent is trifunctional and three fullerenes are linked together, and so forth. However, as fullerenes are amenable to nucleophilic substitution at numerous locations, there is a finite probability when the minimum ratio is used that, for example, a single fullerene may form a link with two others already joined, forming a cluster of three cages and leaving a certain number of fullerene cages unreacted. Therefore, it is desirable to use slightly more than the minimum amount of coupling agent. The maximum amount of coupling agent required depends on the amount of links between cages per fullerene molecule desired. Due to their ability to react at multiple sites, fullerene cages may form links from 1 to 6 neighboring cages. Therefore, in a case where a bifunctional coupling agent is used and links to 6 neighboring cages are desired, a ratio of 3 mols of coupling agent per mol of fullerene should be employed.

The number of fullerene cages per fullerene cluster core may be between 2 and 30, e.g., between 4 and 12. This allows the subsequently derivatized clusters to retain adequate solubility, as well as avoiding the formation of excessively large pores upon subsequent film formation. Fullerene clusters containing more than 30 fullerenes may show deficiencies in these aspects. To achieve the desired cluster size, a ratio of coupling agent to fullerene closer to the minimum amount mentioned above may be used. For example, the ratio of coupling agent to fullerene may be between about 0.5:1 and 0.9:1 when the coupling agent is bifunctional, though other ratios outside of this range may be used.

To form the linked-fullerene cluster cores, the desired coupling agent is mixed with the desired fullerene in a suitable solvent. Fullerenes typically posses much more limited solubility than the coupling agents, so the solvent chosen should exhibit good solvating ability towards fullerenes. One useful solvent is toluene, however, other solvents, including, but not limited to, xylenes, carbon disulfide, 1,2-dichlorobenzene, 1-methylnapthalene, and 1-chloronapthalene may be employed. Reaction of the amine groups of the coupling agent with the fullerene occurs readily at ambient temperature. However, heating the mixture to about 50-60° C. allows the reaction to proceed at a faster rate. As the reaction proceeds, a portion of the fullerene clusters may precipitate from solution, but such precipitates may still be employed in subsequent process steps. After approximately 18 hours, the formation of the fullerene clusters is complete. The solvent of the reaction is removed by distillation and the black residue is retained for use in subsequent steps.

Many possible compounds that are well-suited to form the reactive arms of the soluble fullerene clusters are readily available, and for example, may contain three general parts; a terminal group known to react with fullerenes, a linear organic spacer, and an opposing terminal group capable of undergoing multiple condensation reactions with similar groups.

For example, a terminal group used to couple the radial arms to the fullerene core may be a primary or secondary amine. Anywhere from one to twelve amine molecules may be added to a single $C_{60}$ molecule, the actual number depending largely on their stearic bulk, with the most common number of additions being six. With several reactive sites already occupied by the coupling agent used to form the cluster core, derivatization by the radial arms occurs at the numerous available reactive sites at the periphery of the cluster. Other reactive groups, especially other nucleophiles, may be used. These include, but are not limited to, azides, dienes, and carbanions. However, any reactive group which may be found to conveniently react with fullerenes may be employed.

The organic-spacer portion of the radial arms may comprise an alkyl chain, a polyether chain, a polyunsaturated alkyl chain, or an amine-containing alkyl chain. The chain length of the spacer can be determined in part by the desired mechanical and electrical properties of the deposited network-polymer films. Shorter chain lengths, for example, 3 or 4 carbon units long provides greater rigidity, while longer chains of 10-20 carbon units result in greater flexibility. For example, the organic spacer can be an alkyl chain 3-20 carbon units long, e.g., 3-7 carbon units long. However, when greater rigidity, or other variations of chemical or physical properties are desirable, the alkyl chain may include one or more heteroatomic groups, including, but not limited to, ether groups or amino groups, or one or more rigid components, including, but not limited to, alkynyl-segments, aryl-segments, or other cyclic segments.

The terminal reactive group used for forming the three-dimensional cluster network through condensation reactions with adjacent clusters may be comprised of any of several common functionalities. For example, a metal- or metalloid-alkoxide may be used as a terminal group. Alkoxides readily undergo hydrolysis and condensation reactions, forming polymeric oxides, and bond with, upon hydrolysis, the chemically similar surfaces of solid oxides. Any one of numerous possible alkoxide groups may be used including, but not limited to, $Si(OR)_3$, $Ge(OR)_3$, $Ti(OR)_3$, $Zr(OR)_3$, $Sn(OR)_3$, $Al(OR)_2$ and $B(OR)_2$.

The following are non-limiting examples of commercially available reagents for use as reactive arms; 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexanediaminomethyltriethoxysilane and 11-aminoundecyltriethoxysilane. However, many additional compounds may prove useful.

Figure 3:
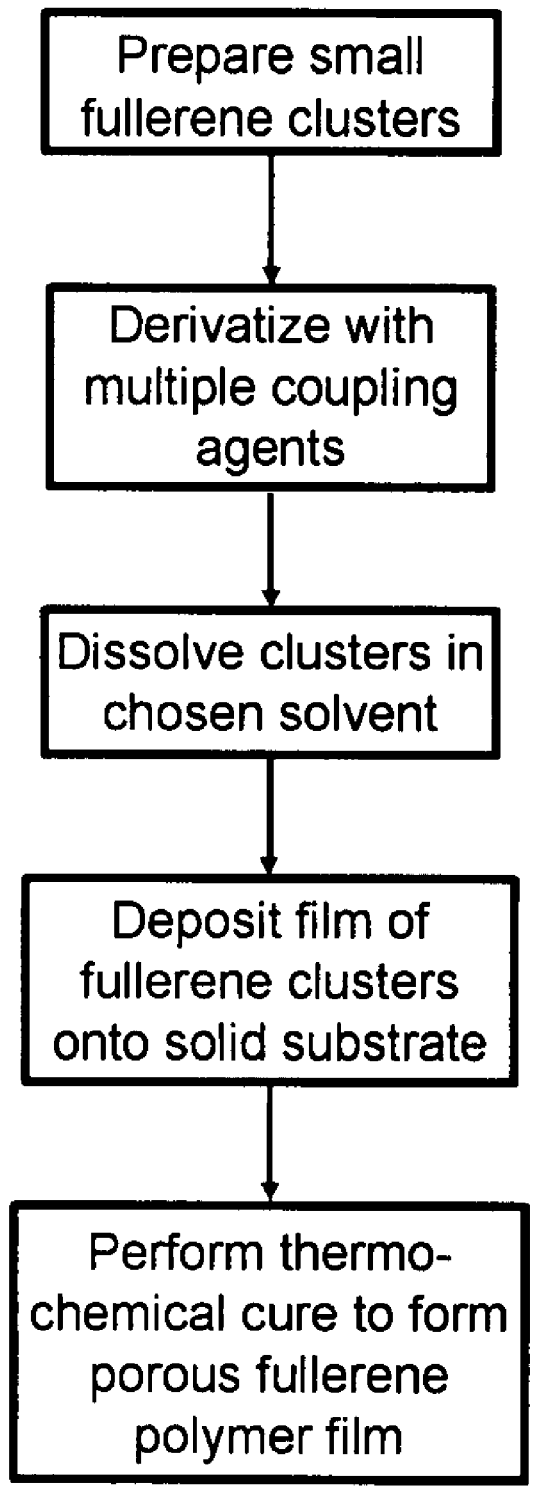
FIG. 3 shows a representation of a process for preparing a fullerene polymer film in accordance with one embodiment of the present invention.

FIG. 3 shows a representation of a process for preparing a fullerene polymer film using fullerene clusters, comprising (a) preparing a fullerene cluster; (b) derivatizing the fullerene cluster with at least one reactive arm to form a derivatized fullerene cluster; (c) dissolving the derivatized fullerene cluster in a solvent; (d) depositing/applying a plurality of derivatized fullerene clusters onto a substrate (e.g. as a film); and (e) curing (e.g., thermochemical curing) the derivatized fullerene clusters to form a fullerene polymer film.

The desired amount of the selected linked-fullerene clusters prepared as above is added to a large excess of the liquid precursor for the radial arms. Initially, the fullerene clusters are insoluble in the liquid and are present as a fine black suspension. Reaction of the amine groups of the arm-forming precursor with the fullerene occurs readily at ambient temperature. However, heating the mixture to about 50-60° C. allows the reaction to proceed at a faster rate. As the reaction proceeds, the partially derivatized fullerene clusters exhibit increased solubility in the reaction medium and the mixture exists as a dark brown solution. After approximately 18 hours, the formation of the fully derivatized fullerene clusters is complete with the maximum number of reactive arms, being added to the linked-fullerene cluster cores. The unreacted arm-forming precursor is removed using vacuum-distillation and recovered for use in future preparations, leaving a deep brown-black residue containing the polyfunctional fullerene clusters. FIG. 1 shows an example of a derivatized fullerene cluster compound, with $C_{60}$ as the fullerene, linked by diaminoalkanes, and with reactive arms derived from 6-aminohexyltriethoxysilane.

The derivatized fullerene clusters possess a moderate-to-high solubility in many common organic solvents, including alkanes, toluene, benzene, ketones, and alcohols. The latter are especially useful, as alcohols, such as ethanol and 2-propanol, and are common and desirable solvents employed for the deposition of spin-on inorganic films in the microelectronics industry. The residue prepared as above can be redissolved in a solvent suitable for application to the desired substrate, such as ethanol.

The derivatized fullerene clusters also possess the ability to form network polymers though condensation reactions with adjacent clusters. With multiple reactive arms surrounding each derivatized fullerene cluster, each cluster can form several strong links with neighboring clusters. Highly-crosslinked polymers show significant increases in both thermal stability and mechanical strength relative to similar polymers that are less crosslinked. Both of these qualities are extremely important for a material that is intended for use in microelectronic devices, where temperatures of about 400° C. as well as strong mechanical forces are common during processing.

The derivatized fullerene clusters also posses the ability to form strong bonds to the common substrates encountered in microelectronic structures. These are typically oxides or metals, two classes of materials that form strong bonds to films derived from alkoxides. Excellent film adhesion is a critical property that a successful dielectric material should possess to achieve use in practice. With multiple reactive groups per cluster, the derivatized fullerene clusters are well-suited to form strong bonds to a desired substrate.

A solution of a plurality the derivatized fullerene clusters can be applied to a desired substrate by any method commonly employed in the art, such as spin-coating, dip-coating, or spray-coating. As used herein, the term "plurality" is meant to indicate more than one, e.g., 2, 5, 10, 50, 100, 1000, etc., of an article. A subsequent thermo-chemical curing step initiates the hydrolysis and condensation reactions of the terminal alkoxide groups of the radial arms, further crosslinking the linked-fullerene clusters and bonding the entire network polymer to the solid substrate. A section of such a network on a solid substrate is shown in FIG. 2, where fullerene cages are represented by hashed circles, junctions formed by the condensation of terminal groups of the radial arms, typically small silica clusters, are shown as black hexagons, and the solid substrate is dotted.

The formation of the network polymer film can be accomplished during a thermo-chemical curing step. This involves exposing the deposited film to conditions which are known to cause the removal of organic groups from alkoxides and their subsequent condensation. For most alkoxides, including those used as terminal groups of the radial arms, elevated temperatures in the presence of moisture are adequate to complete these reactions. Therefore, after a film of the derivatized clusters has been deposited on the desired substrate, the network polymer is formed by heating the coated substrate under a moist atmosphere until all remaining alkoxide groups have been removed. This typically requires temperatures in the range between about 80 and 200° C., though higher temperatures may be employed.

Figure 2:
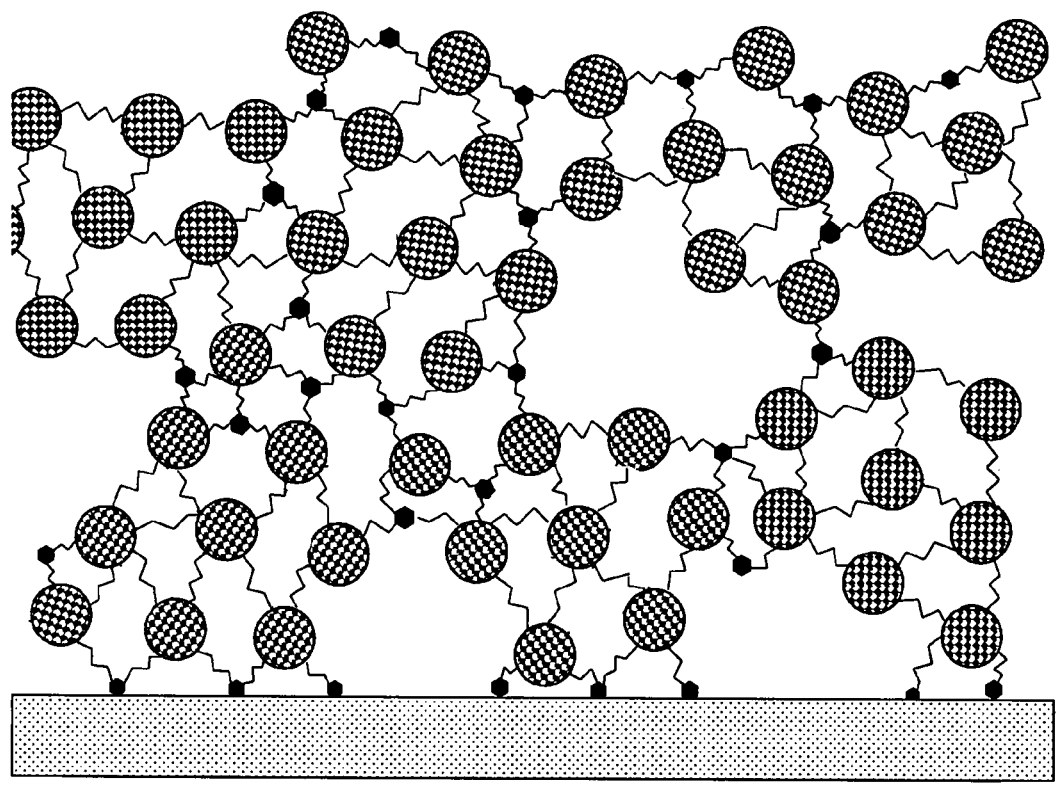
FIG. 2 shows a section of a fullerene cluster polymer film after deposition onto a solid substrate and final curing. Fullerene cages are represented by hashed circles, junctions formed by the condensation of terminal groups of the radial arms are shown as black hexagons, and the solid substrate is dotted.

Such fullerene polymer films contain a significant amount of microporosity, as seen in FIG. 2. This porosity results from the non-ideal packing of the soluble fullerene clusters during film deposition. Microporosity is desirable as the inclusion of porosity into dielectric films is one of few available methods for preparing films with very low dielectric constants, such as below 2.0. In microelectronic devices currently contemplated by industry, pore sizes must be significantly smaller than minimum feature sizes which currently range between about 50 and 200 nm. Larger pores are potential defect sites in such devices. Fullerene clusters typically contain about 10-30 fullerenes per cluster. With a diameter of approximately 1 nm for an individual $C_{60}$ molecule, clusters of this size would possess an average total diameter of between about 2 and 10 nm. Packing of clusters of that size will generate pores on the order of 1-3 nm in diameter, sufficiently small to be useful in microelectronic devices. However, in other applications, where pore size is not a critical concern, larger clusters may be used.

EXAMPLES

The following non-limiting example demonstrates the experimental conditions suitable to prepare a microporous film of polymerized fullerene clusters, useful as a low dielectric constant material.

A microporous polymeric network of derivatized fullerene clusters with a low dielectric constant was prepared as follows. A solution of polyfunctional fullerene clusters was prepared as follows. 150 mL of toluene was mixed with 0.50 grams of $C_{60}$ and 0.73 grams of 1,6 diaminohexane in a 100-mL schlenk flask. The flask was flushed with dry nitrogen, and the mixture heated to 60° C. for 24 hours. During that time the mixture slowly changed from a clear liquid containing a fine black suspended powder to a dark brown solution with a small amount of a black precipitate. The solvent was then removed by vacuum distillation.

20 mL of 6-aminohexyltriethoxysilane was then added to the solid residue from the previous step to form the derivatized fullerene clusters. The resulting mixture was held at 60° C. for 24 hours after which is existed as a deep brown solution. The remaining 6-aminohexyltriethoxysilane was removed by vacuum distillation. This should be accomplished at the lowest possible pressure so that lower distillation temperatures may be employed. After the brown-black residue was dry, a 0.250-gram portion was removed and dissolved in 30 mL of ethanol. This solution was filtered to remove any undissolved material and reserved for use in the next step.

The solution prepared above was coated onto a 2×2-cm section of silicon wafer and allowed to air dry. The coated substrate was then heated to 60° C. for 30 minutes to remove residual solvent. The temperature was then increased to 150° C. and the substrate was held at that temperature under an atmosphere of moist air for 60 minutes. An additional 30 minutes at 300° C. under nitrogen completed the curing process. The resulting brown film exhibited excellent adhesion and scratch resistance and is well-suited for use as a low dielectric constant material.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A method for preparing a fullerene cluster, the method comprising: adding a branched coupling agent terminated by reactive groups at each chain end to three or more fullerenes, whereby the fullerenes are coupled together to form a fullerene cluster.

2. The method of claim 1, wherein the three or more fullerenes comprise $C_{60}$ fullerenes.

3. The method of claim 1, wherein the branched coupling agent comprises a primary or secondary amine.

4. The method of claim 1, wherein the branched coupling agent is selected from the group consisting of: 3 aminopropyl-1,7-diaminoheptane, 4,4-di-4-aminobutyl-1,9-diaminononane, and 1,3,5-tri-4-aminobutylcyclohexane.

5. The method of claim 1, wherein the fullerene cluster comprises between 4 and 12 fullerenes.

6. The method of claim 1, wherein the branched coupling agent includes 3 to 20 carbon units per branch.

7. The method of claim 1, wherein the branched coupling agent includes 3 to 7 carbon units per branch.

8. The method of claim 1, wherein the branched coupling agent includes 3 or 4 carbon units per branch.

9. The method of claim 1, wherein the branched coupling agent includes 10 to 20 carbon units per branch.

10. A method for preparing a fullerene polymer film, comprising:
preparing two or more fullerene clusters by adding a coupling agent to two or more fullerenes, whereby the fullerenes are coupled together to form a fullerene cluster;
derivatizing the fullerene clusters with at least one reactive aim to form derivatized fullerene clusters;
dissolving the derivatized fullerene clusters in a solvent to give a solution;
applying the solution onto a substrate; and
curing the derivatized fullerene clusters to form a fullerene polymer film.

11. The method of claim 10, wherein the at least one reactive arm comprises:
a reactive group coupled to the fullerenes;
an organic spacer portion; and
a metal or metalloid alkoxide.

12. The method of claim 10, wherein the fullerene clusters comprise $C_{60}$ fullerenes.

13. The method of claim 11, wherein the at least one reactive arm comprises:
an amine, an azide, a diene or a carbanion;
an alkyl organic spacer portion; and
a metal or metalloid alkoxide selected from the group consisting of: $-Si(OR)_3$, $-Ge(OR)_3$, $-Ti(OR)_3$, $-Zr(OR)_3$, $-Sn(OR)_3$, $-Al(OR)_2$, and $-B(OR)_2$.

14. The method of claim 11, wherein the at least one reactive arm is selected from the group consisting of: 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexane-diaminomethyltriethoxysilane, and 11-aminoundecyltriethoxysilane.

15. The method of claim 10, wherein said applying comprises spin-coating, dip-coating or spray-coating the solution.

16. The method of claim 10, wherein said curing comprises heating the derivatized fullerene clusters to between about 80° C. to 200° C. in a moist atmosphere.

17. A method for preparing a fullerene polymer film, the method comprising:
preparing two or more fullerene clusters by:
(i) providing two or more $C_{60}$ fullerenes; and
(ii) adding 1,6-diaminohexane to the fullerenes, whereby the fullerenes are coupled together to provide a fullerene cluster;
derivatizing the fullerene clusters with 6-aminohexyltriethoxysilane to give derivatized fullerene clusters;
dissolving the derivatized fullerene clusters in a solvent to give a solution;
applying the solution onto a substrate; and
curing the derivatized fullerene clusters to give a fullerene polymer film.

18. The method of claim 17, wherein said applying comprises coating the solution onto a silicon wafer.

19. The method of claim 17, wherein said curing comprises heating the derivatized fullerene clusters to greater than about 150° C.

* * * * *

UNITED STATES PATENT AND TRADEMARK OFFICE
CERTIFICATE OF CORRECTION

| | | |
|---|---|---|
| PATENT NO. | : 7,790,234 B2 | Page 1 of 1 |
| APPLICATION NO. | : 11/806482 | |
| DATED | : September 7, 2010 | |
| INVENTOR(S) | : Ayers | |

It is certified that error appears in the above-identified patent and that said Letters Patent is hereby corrected as shown below:

In Column 2, Line 47, delete "know" and insert -- known --, therefor.

In Column 3, Line 48, delete "posses" and insert -- possess --, therefor.

In Column 3, Line 53, delete "1-chloronapthalene" and insert -- 1-chloronaphthalene --, therefor.

In Column 5, Line 37, delete "posses" and insert -- possess --, therefor.

In Column 7, Line 21, in Claim 4, delete "3 aminopropyl-" and insert -- 3-aminopropyl- --, therefor.

In Column 7, Line 41, in Claim 10, delete "aim" and insert -- arm --, therefor.

Signed and Sealed this
Twenty-fifth Day of December, 2012

David J. Kappos
*Director of the United States Patent and Trademark Office*